United States Patent
Bertness (10) Patent No.: US 7,598,743 B2
(45) Date of Patent: Oct. 6, 2009

(54) BATTERY MAINTENANCE DEVICE HAVING DATABUS CONNECTION

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 299 days.

(21) Appl. No.: 11/063,247

(22) Filed: Feb. 22, 2005

(65) Prior Publication Data

US 2005/0212521 A1    Sep. 29, 2005

Related U.S. Application Data

(63) Continuation-in-part of application No. 10/958,812, filed on Oct. 5, 2004, now Pat. No. 7,446,536, which is a continuation-in-part of application No. 10/460,749, filed on Jun. 12, 2003, now Pat. No. 6,967,484, which is a continuation-in-part of application No. 10/280,186, filed on Oct. 25, 2002, now Pat. No. 6,759,849, which is a continuation-in-part of application No. 09/816,768, filed on Mar. 23, 2001, now Pat. No. 6,586,941.

(60) Provisional application No. 60/192,222, filed on Mar. 27, 2000.

(51) Int. Cl.
*G01N 27/416* (2006.01)

(52) U.S. Cl. .................. 324/426; 324/432; 324/537; 320/132; 702/183

(58) Field of Classification Search ............... 324/426, 324/427, 429, 430, 431, 432, 435, 437, 537; 702/63, 183; 320/132, 149, 104, 105, 162
See application file for complete search history.

(56) References Cited

U.S. PATENT DOCUMENTS

| 2,000,665 A | 5/1935 | Neal | 439/440 |
|---|---|---|---|
| 2,417,940 A | 3/1947 | Lehman | 200/61.25 |
| 2,514,745 A | 7/1950 | Dalzell | 324/115 |
| 2,727,221 A | 12/1955 | Springg | 340/447 |
| 3,178,686 A | 4/1965 | Mills | 340/447 |
| 3,223,969 A | 12/1965 | Alexander | 340/447 |
| 3,267,452 A | 8/1966 | Wolf | 340/249 |

(Continued)

FOREIGN PATENT DOCUMENTS

EP    0 982 159 A2    3/2000

(Continued)

OTHER PUBLICATIONS

Office Action for U.S. Appl. No. 10/958,812, filed Oct. 5, 2004; mailed Nov. 16, 2007; 4 pages.

(Continued)

*Primary Examiner*—Akm E Ullah
*Assistant Examiner*—Arun Williams
(74) *Attorney, Agent, or Firm*—Westerman, Champlin & Kelly, P.A.

(57) ABSTRACT

An electronic battery tester or charger for use with a storage battery includes a first and a second electrical connector configured to electrically couple to terminals of the storage battery. Circuitry operates on the storage battery. OBD communication circuitry is configured to couple to an OBD databus of a vehicle. The operation of the circuitry is a function of communication on the OBD databus.

69 Claims, 4 Drawing Sheets

U.S. PATENT DOCUMENTS

| | | | |
|---|---|---|---|
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,816,805 A | 6/1974 | Terry | 320/123 |
| 3,850,490 A | 11/1974 | Zehr | 439/822 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/430 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 702/63 |
| 4,280,457 A | 7/1981 | Bloxham | 123/198 R |
| 4,297,639 A | 10/1981 | Branham | 324/429 |
| 4,315,204 A | 2/1982 | Sievers et al. | 322/28 |
| 4,316,185 A | 2/1982 | Watrous et al. | 320/116.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,968,941 A | 11/1990 | Rogers | 324/428 |
| 4,968,942 A | 11/1990 | Palanisamy | 324/430 |
| 4,983,086 A | 1/1991 | Hatrock | 411/259 |
| 5,004,979 A | 4/1991 | Marino et al. | 324/160 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |

| Patent No. | Kind | Date | Inventor | Class |
|---|---|---|---|---|
| 5,214,370 | A | 5/1993 | Harm et al. | 320/152 |
| 5,214,385 | A | 5/1993 | Gabriel et al. | 324/434 |
| 5,241,275 | A | 8/1993 | Fang | 324/430 |
| 5,254,952 | A | 10/1993 | Salley et al. | 324/429 |
| 5,266,880 | A | 11/1993 | Newland | 320/125 |
| 5,281,919 | A | 1/1994 | Palanisamy | 324/427 |
| 5,281,920 | A | 1/1994 | Wurst | 324/430 |
| 5,295,078 | A | 3/1994 | Stich et al. | 700/297 |
| 5,298,797 | A | 3/1994 | Redl | 327/387 |
| 5,300,874 | A | 4/1994 | Shimamoto et al. | 320/106 |
| 5,302,902 | A | 4/1994 | Groehl | 324/434 |
| 5,313,152 | A | 5/1994 | Wozniak et al. | 320/118 |
| 5,315,287 | A | 5/1994 | Sol | 340/455 |
| 5,321,626 | A | 6/1994 | Palladino | 702/63 |
| 5,321,627 | A | 6/1994 | Reher | 702/63 |
| 5,323,337 | A | 6/1994 | Wilson et al. | 702/73 |
| 5,325,041 | A | 6/1994 | Briggs | 320/149 |
| 5,331,268 | A | 7/1994 | Patino et al. | 320/158 |
| 5,332,927 | A | 7/1994 | Paul et al. | 307/66 |
| 5,336,993 | A | 8/1994 | Thomas et al. | 324/158.1 |
| 5,338,515 | A | 8/1994 | Dalla Betta et al. | 422/95 |
| 5,339,018 | A | 8/1994 | Brokaw | 320/147 |
| 5,343,380 | A | 8/1994 | Champlin | 363/46 |
| 5,347,163 | A | 9/1994 | Yoshimura | 307/66 |
| 5,352,968 | A | 10/1994 | Reni et al. | 320/136 |
| 5,357,519 | A | 10/1994 | Martin et al. | 371/15.1 |
| 5,365,160 | A | 11/1994 | Leppo et al. | 320/160 |
| 5,365,453 | A | 11/1994 | Startup et al. | 702/36 |
| 5,369,364 | A | 11/1994 | Renirie et al. | 324/430 |
| 5,381,096 | A | 1/1995 | Hirzel | 324/427 |
| 5,402,007 | A * | 3/1995 | Center et al. | 290/40 B |
| 5,410,754 | A | 4/1995 | Klotzbach et al. | 370/466 |
| 5,412,308 | A | 5/1995 | Brown | 323/267 |
| 5,412,323 | A | 5/1995 | Kato et al. | 324/429 |
| 5,425,041 | A | 6/1995 | Seko et al. | 372/45.01 |
| 5,426,371 | A | 6/1995 | Salley et al. | 324/429 |
| 5,426,416 | A | 6/1995 | Jefferies et al. | 340/664 |
| 5,432,025 | A | 7/1995 | Cox | 429/65 |
| 5,432,426 | A | 7/1995 | Yoshida | 320/160 |
| 5,434,495 | A | 7/1995 | Toko | 320/135 |
| 5,435,185 | A | 7/1995 | Eagan | 73/587 |
| 5,442,274 | A | 8/1995 | Tamai | 320/146 |
| 5,445,026 | A | 8/1995 | Eagan | 73/591 |
| 5,449,996 | A | 9/1995 | Matsumoto et al. | 320/148 |
| 5,449,997 | A | 9/1995 | Gilmore et al. | 320/148 |
| 5,451,881 | A | 9/1995 | Finger | 324/433 |
| 5,453,027 | A | 9/1995 | Buell et al. | 439/433 |
| 5,457,377 | A | 10/1995 | Jonsson | 324/430 |
| 5,459,660 | A * | 10/1995 | Berra | 701/33 |
| 5,469,043 | A | 11/1995 | Cherng et al. | 320/161 |
| 5,485,090 | A | 1/1996 | Stephens | 324/433 |
| 5,488,300 | A | 1/1996 | Jamieson | 324/432 |
| 5,504,674 | A | 4/1996 | Chen et al. | 705/4 |
| 5,508,599 | A | 4/1996 | Koenck | 320/138 |
| 5,519,383 | A | 5/1996 | De La Rosa | 340/636.15 |
| 5,528,148 | A | 6/1996 | Rogers | 320/137 |
| 5,537,967 | A | 7/1996 | Tashiro et al. | 123/192.1 |
| 5,541,489 | A | 7/1996 | Dunstan | 320/134 |
| 5,546,317 | A | 8/1996 | Andrieu | 702/63 |
| 5,548,273 | A | 8/1996 | Nicol et al. | 340/439 |
| 5,550,485 | A | 8/1996 | Falk | 324/772 |
| 5,561,380 | A | 10/1996 | Sway-Tin et al. | 324/509 |
| 5,562,501 | A | 10/1996 | Kinoshita et al. | 439/852 |
| 5,563,496 | A | 10/1996 | McClure | 320/128 |
| 5,572,136 | A | 11/1996 | Champlin | 324/426 |
| 5,573,611 | A | 11/1996 | Koch et al. | 152/152.1 |
| 5,574,355 | A | 11/1996 | McShane et al. | 320/161 |
| 5,578,915 | A | 11/1996 | Crouch, Jr. et al. | 324/428 |
| 5,583,416 | A | 12/1996 | Klang | 320/160 |
| 5,585,416 | A | 12/1996 | Audett et al. | 522/35 |
| 5,585,728 | A | 12/1996 | Champlin | 324/427 |
| 5,589,757 | A | 12/1996 | Klang | 320/160 |
| 5,592,093 | A | 1/1997 | Klingbiel | 324/426 |
| 5,592,094 | A | 1/1997 | Ichikawa | 324/427 |
| 5,596,260 | A | 1/1997 | Moravec et al. | 320/135 |
| 5,598,098 | A | 1/1997 | Champlin | 324/430 |
| 5,602,462 | A | 2/1997 | Stich et al. | 323/258 |
| 5,606,242 | A | 2/1997 | Hull et al. | 320/106 |
| 5,614,788 | A | 3/1997 | Mullins et al. | 315/82 |
| 5,621,298 | A | 4/1997 | Harvey | 320/134 |
| 5,633,985 | A | 5/1997 | Severson et al. | 704/267 |
| 5,637,978 | A | 6/1997 | Kellett et al. | 320/104 |
| 5,642,031 | A | 6/1997 | Brotto | 320/156 |
| 5,650,937 | A | 7/1997 | Bounaga | 702/65 |
| 5,652,501 | A | 7/1997 | McClure et al. | 340/636.15 |
| 5,653,659 | A | 8/1997 | Kunibe et al. | 477/111 |
| 5,654,623 | A | 8/1997 | Shiga et al. | 320/106 |
| 5,656,920 | A | 8/1997 | Cherng et al. | 324/431 |
| 5,661,368 | A | 8/1997 | Deol et al. | 315/82 |
| 5,675,234 | A | 10/1997 | Greene | 340/636.11 |
| 5,677,077 | A | 10/1997 | Faulk | 429/90 |
| 5,684,678 | A | 11/1997 | Barrett | 363/17 |
| 5,699,050 | A | 12/1997 | Kanazawa | 340/636.13 |
| 5,701,089 | A | 12/1997 | Perkins | 324/772 |
| 5,705,929 | A | 1/1998 | Caravello et al. | 324/430 |
| 5,707,015 | A | 1/1998 | Guthrie | 241/120 |
| 5,710,503 | A | 1/1998 | Sideris et al. | 320/116 |
| 5,711,648 | A | 1/1998 | Hammerslag | 414/800 |
| 5,717,336 | A | 2/1998 | Basell et al. | 324/430 |
| 5,717,937 | A | 2/1998 | Fritz | 713/300 |
| 5,739,667 | A | 4/1998 | Matsuda et al. | 320/128 |
| 5,744,962 | A | 4/1998 | Alber et al. | 324/426 |
| 5,745,044 | A | 4/1998 | Hyatt, Jr. et al. | 340/5.23 |
| 5,747,189 | A | 5/1998 | Perkins | 429/91 |
| 5,747,909 | A | 5/1998 | Syverson et al. | 310/156.56 |
| 5,747,967 | A | 5/1998 | Muljadi et al. | 320/148 |
| 5,754,417 | A | 5/1998 | Nicollini | 363/60 |
| 5,757,192 | A | 5/1998 | McShane et al. | 324/427 |
| 5,760,587 | A | 6/1998 | Harvey | 324/434 |
| 5,772,468 | A | 6/1998 | Kowalski et al. | 439/506 |
| 5,773,978 | A | 6/1998 | Becker | 324/430 |
| 5,778,326 | A | 7/1998 | Moroto et al. | 701/22 |
| 5,780,974 | A | 7/1998 | Pabla et al. | 315/82 |
| 5,780,980 | A | 7/1998 | Naito | 318/139 |
| 5,789,899 | A | 8/1998 | van Phuoc et al. | 320/112 |
| 5,793,359 | A | 8/1998 | Ushikubo | 345/169 |
| 5,796,239 | A | 8/1998 | van Phuoc et al. | 320/107 |
| 5,808,469 | A | 9/1998 | Kopera | 324/434 |
| 5,811,979 | A | 9/1998 | Rhein | 324/718 |
| 5,818,234 | A | 10/1998 | McKinnon | 324/433 |
| 5,820,407 | A | 10/1998 | Morse et al. | 439/504 |
| 5,821,756 | A | 10/1998 | McShane et al. | 324/430 |
| 5,821,757 | A | 10/1998 | Alvarez et al. | 324/434 |
| 5,825,174 | A | 10/1998 | Parker | 324/106 |
| 5,831,435 | A | 11/1998 | Troy | 324/426 |
| 5,832,396 | A | 11/1998 | Moroto et al. | 701/22 |
| 5,850,113 | A | 12/1998 | Weimer et al. | 307/125 |
| 5,862,515 | A | 1/1999 | Kobayashi et al. | 702/63 |
| 5,865,638 | A | 2/1999 | Trafton | 439/288 |
| 5,871,858 | A | 2/1999 | Thomsen et al. | 429/7 |
| 5,872,443 | A | 2/1999 | Williamson | 320/160 |
| 5,872,453 | A | 2/1999 | Shimoyama et al. | 324/431 |
| 5,883,306 | A | 3/1999 | Hwang | 73/146.8 |
| 5,895,440 | A | 4/1999 | Proctor et al. | 702/63 |
| 5,903,154 | A | 5/1999 | Zhang et al. | 324/437 |
| 5,903,716 | A | 5/1999 | Kimber et al. | 395/114 |
| 5,912,534 | A | 6/1999 | Benedict | 315/82 |
| 5,914,605 | A | 6/1999 | Bertness | 324/430 |
| 5,927,938 | A | 7/1999 | Hammerslag | 414/809 |
| 5,929,609 | A | 7/1999 | Joy et al. | 322/25 |
| 5,939,855 | A | 8/1999 | Proctor et al. | 320/104 |
| 5,939,861 | A | 8/1999 | Joko et al. | 320/122 |
| 5,945,829 | A | 8/1999 | Bertness | 324/430 |
| 5,946,605 | A | 8/1999 | Takahisa et al. | 455/68 |
| 5,951,229 | A | 9/1999 | Hammerslag | 414/398 |
| 5,961,561 | A | 10/1999 | Wakefield, II | 701/29 |

| Patent | Date | Inventor | Class |
|---|---|---|---|
| 5,961,604 A | 10/1999 | Anderson et al. | 709/229 |
| 5,969,625 A | 10/1999 | Russo | 340/636.19 |
| 5,978,805 A | 11/1999 | Carson | 707/10 |
| 5,982,138 A | 11/1999 | Krieger | 320/105 |
| 6,002,238 A | 12/1999 | Champlin | 320/134 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A * | 3/2000 | Koike et al. | 320/104 |
| 6,037,749 A | 3/2000 | Parsonage | 320/132 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,081,098 A | 6/2000 | Bertness et al. | 320/134 |
| 6,081,109 A | 6/2000 | Seymour et al. | 324/127 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,100,670 A | 8/2000 | Levesque | 320/150 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,164,063 A * | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,181,545 B1 | 1/2001 | Amatucci et al. | 361/502 |
| 6,211,651 B1 | 4/2001 | Nemoto | 320/133 |
| 6,215,275 B1 | 4/2001 | Bean | 320/106 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/426 |
| D442,503 S | 5/2001 | Lundbeck et al. | D10/77 |
| 6,225,808 B1 | 5/2001 | Varghese et al. | 324/426 |
| 6,236,332 B1 | 5/2001 | Conkright et al. | 340/3.1 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,263,268 B1 * | 7/2001 | Nathanson | 701/29 |
| 6,271,643 B1 | 8/2001 | Becker et al. | 320/112 |
| 6,271,748 B1 | 8/2001 | Derbyshire et al. | 340/442 |
| 6,275,008 B1 | 8/2001 | Arai et al. | 320/132 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/134 |
| 6,313,608 B1 | 11/2001 | Varghese et al. | 320/132 |
| 6,316,914 B1 | 11/2001 | Bertness | 320/134 |
| 6,320,351 B1 | 11/2001 | Ng et al. | 320/104 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,377,031 B1 | 4/2002 | Karuppana et al. | 323/220 |
| 6,384,608 B1 | 5/2002 | Namaky | 324/430 |
| 6,388,448 B1 | 5/2002 | Cervas | 324/426 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,505,507 B1 | 1/2003 | Imao | 73/146.5 |
| 6,507,196 B2 | 1/2003 | Thomsen et al. | 324/436 |
| 6,526,361 B1 | 2/2003 | Jones et al. | 702/63 |
| 6,529,723 B1 * | 3/2003 | Bentley | 455/405 |
| 6,531,848 B1 | 3/2003 | Chitsazan et al. | 320/153 |
| 6,532,425 B1 | 3/2003 | Boost et al. | 702/63 |
| 6,534,993 B2 | 3/2003 | Bertness | 324/433 |
| 6,544,078 B2 | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/378 |
| 6,570,385 B1 | 5/2003 | Roberts et al. | 324/378 |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 * | 8/2003 | Lowrey et al. | 701/29 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 324/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |

| Patent No. | Date | Inventor | Class |
|---|---|---|---|
| 6,740,990 B2 | 5/2004 | Tozuka et al. | 307/9.1 |
| 6,744,149 B1 | 6/2004 | Karuppana et al. | 307/31 |
| 6,745,153 B2* | 6/2004 | White et al. | 702/184 |
| 6,759,849 B2 | 7/2004 | Bertness et al. | 324/426 |
| 6,777,945 B2 | 8/2004 | Roberts et al. | 324/426 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,842,707 B2 | 1/2005 | Raichle et al. | 702/62 |
| 6,850,037 B2 | 2/2005 | Bertness | 320/132 |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,967,484 B2 | 11/2005 | Bertness | 324/426 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2 | 3/2006 | Smith et al. | 324/426 |
| 7,058,525 B2 | 6/2006 | Bertness et al. | 702/63 |
| 7,081,755 B2 | 7/2006 | Klang et al. | 324/426 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,126,341 B2 | 10/2006 | Bertness et al. | 324/426 |
| 7,129,706 B2 | 10/2006 | Kalley | 324/426 |
| 7,272,519 B2 | 9/2007 | Lesesky et al. | 702/63 |
| 2002/0004694 A1* | 1/2002 | Mcleod et al. | 701/29 |
| 2002/0010558 A1 | 1/2002 | Bertness et al. | 702/63 |
| 2002/0041175 A1 | 4/2002 | Lauper et al. | 320/106 |
| 2002/0044050 A1 | 4/2002 | Derbyshire et al. | 340/442 |
| 2002/0171428 A1 | 11/2002 | Bertness | 702/63 |
| 2002/0176010 A1 | 11/2002 | Wallach et al. | 348/362 |
| 2003/0009270 A1 | 1/2003 | Breed | 701/29 |
| 2003/0025481 A1 | 2/2003 | Bertness | 324/427 |
| 2003/0036909 A1 | 2/2003 | Kato | 704/275 |
| 2003/0088375 A1 | 5/2003 | Bertness et al. | 702/63 |
| 2003/0169018 A1 | 9/2003 | Berels et al. | 320/132 |
| 2003/0184262 A1 | 10/2003 | Makhija | 320/156 |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0214395 A1 | 11/2003 | Flowerday et al. | 340/445 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0044452 A1* | 3/2004 | Bauer et al. | 701/33 |
| 2004/0049361 A1 | 3/2004 | Hamdan et al. | 702/115 |
| 2004/0051533 A1 | 3/2004 | Namaky | 324/426 |
| 2004/0054503 A1 | 3/2004 | Namky | 702/183 |
| 2004/0113588 A1 | 6/2004 | Mikuriya et al. | 320/128 |
| 2004/0145342 A1 | 7/2004 | Lyon | 320/108 |
| 2004/0227523 A1 | 11/2004 | Namky | 324/537 |
| 2004/0239332 A1* | 12/2004 | Mackel et al. | 324/426 |
| 2005/0017726 A1 | 1/2005 | Koran et al. | 324/433 |
| 2005/0043868 A1* | 2/2005 | Mitcham | 701/29 |
| 2005/0057256 A1 | 3/2005 | Bertness | 324/426 |
| 2005/0102073 A1 | 5/2005 | Ingram | 701/29 |
| 2005/0182536 A1* | 8/2005 | Doyle et al. | 701/29 |
| 2005/0254106 A9 | 11/2005 | Silverbrook et al. | 358/539 |
| 2005/0256617 A1* | 11/2005 | Cawthorne et al. | 701/22 |
| 2006/0030980 A1* | 2/2006 | St. Denis | 701/29 |
| 2006/0089767 A1* | 4/2006 | Sowa | 701/29 |
| 2006/0217914 A1 | 9/2006 | Bertness | 702/113 |

FOREIGN PATENT DOCUMENTS

| | | |
|---|---|---|
| GB | 2 275 783 A | 7/1994 |
| JP | 05211724 A | 8/1993 |
| WO | WO 96/01456 | 1/1996 |
| WO | WO 96/06747 | 3/1996 |
| WO | WO 03/047064 A3 | 6/2003 |
| WO | WO 2004/047215 A1 | 6/2004 |

OTHER PUBLICATIONS

"Electrochemical Impedance Spectroscopy in Battery Development and Testing", *Batteries International*, Apr. 1997, pp. 59 and 62-63.

"Battery Impedance", by E. Willihnganz et al., *Electrical Engineering*, Sep. 1959, pp. 922-925.

"Determining the End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987, IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc.*, ANSI/IEEE Std. 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Wilihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design A 60 Hz Notch Filter with the UAF42", Jan. 1994, AB-071, 1994.

National Semiconductor Corporation, "LMF90-4th-Order Elliptic Notch Filter", Dec. 1994, RRD-B30M115, Dec. 1994.

"Alligator Clips with Wire Penetrators" *J. S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC-DC Converts Allows Use of Single Battery", *Electronix Express*, downloaded from http://www.elexp.com/t_dc-dc.htm, undated.

"DC-DC Converter Basics", *Power Designers*, downloaded from http://www.powederdesigners.com/InforWeb.design_center/articles/DC-DC/converter.shtm, undated.

"Notification of Transmittal of The International Search Report or the Declaration", PCT/US02/29461.

"Notification of Transmittal of The International Search Report or the Declaration", PCT/US03/07546.

"Notification of Transmittal of The International Search Report or the Declaration", PCT/US03/06577.

"Notification of Transmittal of The International Search Report or the Declaration", PCT/US03/07837.

"Improved Impedance Spectroscopy Technique For Status Determination of Production Li/SO$_2$ Batteries" Terrill Atwater et al., pp. 10-113, (1992).

"Notification of Transmittal of The International Search Report or the Declaration", PCT/US03/41561.

"Notification of Transmittal of The International Search Report or the Declaration", PCT/US03/27696.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois, pp. 1-1-14-13, (1991).

"Dynamic modelling of lead/acid batteries using impedance spectroscopy for parameter identification", Journal of Power Sources, pp. 69-84, (1997).

Notification of Transmittal of the International Search Report for PCT/US03/30707.

"A review of impedance measurements for determination of the state-of-charge or state-of-health of secondary batteries", Journal of Power Sources, pp. 59-69, (1998).

"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.

Wikipedia Online Encyclopedia, Inductance, 2005, http://en.wikipedia.org/wiki/inductance, pp. 1-5, mutual Inductance, pp. 3, 4.

"Professional BCS System Analyzer Battery-Charger-Starting", pp. 2-8, (2001).

Young Illustrated Encyclopedia Dictionary of Electronics, 1981, Parker Publishing Company, Inc., pp. 318-319.

\* cited by examiner

BATTERY MAINTENANCE DEVICE HAVING DATABUS CONNECTION

BACKGROUND OF THE INVENTION

The present application is a Continuation-In-Part of U.S. Ser. No. 10/958,812, filed Oct. 5, 2004, which is a Continuation-In-Part of U.S. Ser. No. 10/460,749, filed Jun. 12, 2003, which is a Continuation-In-Part of U.S. Ser. No. 10/280,186, filed Oct. 25, 2002, now U.S. Pat. No. 6,759,849, the present application is also a Continuation-In-Part of U.S. patent application Ser. No. 09/816,768, filed Mar. 23, 2001, now U.S. Pat. No. 6,586,941, which claims the benefit of U.S. provisional patent application Ser. No. 60/192,222, filed Mar. 27, 2000, the contents of which are hereby incorporated by reference in their entirety.

The present invention relates to battery chargers and/or testers of the type used to test and/or charge storage batteries. More specifically, the present invention relates to such devices capable of interfacing with other types of equipment.

Various types of battery testers and charging equipment are known in the art. Examples of various battery testers, chargers and monitors are forth in U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER DEVICE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,871,858, issued Feb. 16, 1999, entitled ANTI-THEFT BATTERY; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled, ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM; U.S. Pat. No. 6,377,031, issued Apr. 23, 2002, entitled INTELLIGENT SWITCH FOR POWER MANAGEMENT; U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,465,908, issued Oct. 15, 2002, entitled INTELLIGENT POWER MANAGEMENT SYSTEM; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,469,511, issued Nov. 22, 2002, entitled BATTERY CLAMP WITH EMBEDDED ENVIRONMENT SENSOR; U.S. Pat. No. 6,495,990, issued Dec. 17, 2002, entitled METHOD AND APPARATUS FOR EVALUATING STORED CHARGE IN AN ELECTROCHEMICAL CELL OR BATTERY; U.S. Pat. No. 6,497,209, issued Dec. 24, 2002, entitled SYSTEM AND METHOD FOR PROTECTING A CRANKING SUBSYSTEM; U.S. Pat. No. 6,507,196, issued Jan. 14, 2003; entitled BATTERY HAVING DISCHARGE STATE INDICATION; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Pat. No. 6,707,303, issued Mar. 16, 2004, entitled ELECTRONIC BATTERY TESTER; U.S. Pat. No. 6,737,831, issued May 18, 2004, entitled METHOD AND APPARATUS USING A CIRCUIT MODEL TO EVALUATE CELL/BATTERY PARAMETERS; U.S. Pat. No. 6,744,149, issued Jun. 1, 2004, entitled SYSTEM AND METHOD FOR PROVIDING STEP-DOWN POWER CONVERSION USING AN INTELLIGENT SWITCH; U.S. Pat. No. 6,759,849, issued Jul. 6, 2004, entitled BATTERY TESTER CONFIGURED TO RECEIVE A REMOVABLE DIGITAL MODULE; U.S. Pat. No. 6,781,382, issued Aug. 24, 2004, entitled ELECTRONIC BATTERY TESTER; U.S. Pat. No. 6,788,025, filed Sep. 7, 2004, entitled BATTERY CHARGER WITH BOOSTER PACK; U.S. Pat. No. 6,795,782, issued Sep. 21, 2004, entitled BATTERY TEST MODULE; U.S. Pat. No. 6,805,090, filed Oct. 19, 2004, entitled CHARGE CONTROL SYSTEM FOR A VEHICLE BATTERY; U.S. Pat. No. 6,806,716, filed Oct. 19, 2004, entitled ELECTRONIC BATTERY TESTER; U.S. Pat. No. 6,850,037, filed Feb. 1, 2005, entitled IN-VEHICLE BATTERY MONITORING; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 10/042,451, filed Jan. 8, 2002, entitled BATTERY CHARGE CONTROL. DEVICE; U.S. Ser. No. 10/093,853, filed Mar. 7, 2002, entitled ELECTRONIC BATTERY TESTER WITH NETWORK COMMUNICATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002, entitled BOOSTER PACK WITH STORAGE CAPACITOR; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/387,046, filed Jun. 7, 2002, entitled METHOD AND APPARATUS FOR INCREASING THE LIFE OF A STORAGE BATTERY; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 10/246,439, filed Sep. 18, 2002, entitled BATTERY TESTER UPGRADE USING SOFTWARE KEY; U.S. Ser. No. 10/263,473, filed Oct. 2, 2002, entitled ELECTRONIC BAT- TERY TESTER WITH RELATIVE TEST OUTPUT; U.S. Ser. No. 10/310,385, filed Dec. 5, 2002, entitled BATTERY TEST MODULE; U.S. Ser. No. 60/437,224, filed Dec. 31, 2002, entitled DISCHARGE VOLTAGE PREDICTIONS; U.S. Ser. No. 10/349,053, filed Jan. 22, 2003, entitled APPARATUS AND METHOD FOR PROTECTING A BATTERY FROM OVERDISCHARGE; U.S. Ser. No. 10/388,855, filed Mar. 14, 2003, entitled ELECTRONIC BATTERY TESTER WITH BATTERY FAILURE TEMPERATURE DETERMINATION; U.S. Ser. No. 10/396,550, filed Mar. 25, 2003, entitled ELECTRONIC BATTERY TESTER; U.S. Ser. No. 60/467,872, filed May 5, 2003, entitled METHOD FOR DETERMINING BATTERY STATE OF CHARGE; U.S. Ser. No. 60/477,082, filed Jun. 9, 2003, entitled ALTERNATOR TESTER; U.S. Ser. No. 10/460,749, filed Jun. 12, 2003, entitled MODULAR BATTERY TESTER FOR SCAN TOOL; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/601,608, filed Jun. 23, 2003, entitled CABLE FOR ELECTRONIC BATTERY TESTER; U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY; U.S. Ser. No. 10/656,526, filed Sep. 5, 2003, entitled METHOD AND APPARATUS FOR MEASURING A PARAMETER OF A VEHICLE ELECTRICAL SYSTEM; U.S. Ser. No. 10/656,538, filed Sep. 5, 2003, entitled ALTERNATOR TESTER WITH ENCODED OUTPUT; U.S. Ser. No. 10/675,933, filed Sep. 30, 2003, entitled QUERY BASED ELECTRONIC BATTERY TESTER; U.S. Ser. No. 10/678,629, filed Oct. 3, 2003, entitled ELECTRONIC BATTERY TESTER/CHARGER WITH INTEGRATED BATTERY CELL TEMPERATURE MEASUREMENT DEVICE; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 60/488,775, filed Jul. 21, 2003, entitled ULTRASONICALLY ASSISTED CHARGING; U.S. Ser. No. 10/258,441, filed Apr. 9, 2003, entitled CURRENT MEASURING CIRCUIT SUITED FOR BATTERIES; U.S. Ser. No. 10/705,020, filed Nov. 11, 2003, entitled APPARATUS AND METHOD FOR SIMULATING A BATTERY TESTER WITH A FIXED RESISTANCE LOAD; U.S. Ser. No. 10/681,666, filed Oct. 8, 2003, entitled ELECTRONIC BATTERY TESTER WITH PROBE LIGHT; U.S. Ser. No. 10/748,792, filed Dec. 30, 2003, entitled APPARATUS AND METHOD FOR PREDICTING THE REMAINING DISCHARGE TIME OF A BATTERY; U.S. Ser. No. 10/783,682, filed Feb. 20, 2004, entitled REPLACEABLE CLAMP FOR ELECTRONIC BATTERY TESTER; U.S. Ser. No. 60/548,513, filed Feb. 27, 2004, entitled WIRELESS BATTERY MONITOR; U.S. Ser. No. 10/791,141, filed Mar. 2, 2004, entitled METHOD AND APPARATUS FOR AUDITING A BATTERY TEST; U.S. Ser. No. 60/557,366, filed Mar. 29, 2004, entitled BATTERY MONITORING SYSTEM WITHOUT CURRENT MEASUREMENT; U.S. Ser. No. 10/823,140, filed Apr. 13, 2004, entitled THEFT PREVENTION DEVICE FOR AUTOMOTIVE VEHICLE SERVICE CENTERS; U.S. Ser. No. 60/575,945, filed Jun. 1, 2004, entitled BATTERY TESTER CAPABLE OF IDENTIFYING FAULTY BATTERY POST ADAPTERS; U.S. Ser. No. 60/577,345, filed Jun. 4, 2004, entitled NEW METHOD FOR AUTOMATICALLY TESTING A BATTERY AND TRANSMITTING DATA TO ANOTHER MODULE IN A VEHICLE; U.S. Ser. No. 10/864,904, filed Jun. 9, 2004, entitled ALTERNATOR TESTER; U.S. Ser. No. 10/867,385, filed Jun. 14, 2004, entitled ENERGY MANAGEMENT SYSTEM FOR AUTOMOTIVE VEHICLE; U.S. Ser. No. 10/870,680, filed Jun. 17, 2004, entitled ELECTRONIC BATTERY TESTER WITH RELATIVE TEST OUTPUT; U.S. Ser. No. 60/582,925, filed Jun. 25, 2004, entitled BATTERY TESTER WITH BATTERY POTENTIAL FOR RECOVERY OUTPUT; U.S. Ser. No. 10/883,019, filed Jul. 1, 2004, entitled MODULAR ELECTRONIC BATTERY TESTER; U.S. Ser. No. 60/585,700, filed Jul. 6, 2004, entitled TEST STATION; U.S. Ser. No. 10/896,835, filed Jul. 22, 2004, entitled BROAD-BAND LOW-INDUCTANCE CABLES FOR MAKING KELVIN CONNECTIONS TO ELECTROCHEMICAL CELLS AND BATTERIES; U.S. Ser. No. 10/896,834, filed Jul. 22, 2004, entitled ELECTRONIC BATTERY TESTER; U.S. Ser. No. 10/897,801, filed Jul. 23, 2004, entitled SHUNT CONNECTION TO A PCB FOR AN ENERGY MANAGEMENT SYSTEM EMPLOYED IN AN AUTOMOTIVE VEHICLE; U.S. Ser. No. 10/914,304, filed Aug. 9, 2004, entitled ELECTRONIC BATTERY TESTER WITH NETWORK COMMUNICATION U.S. Ser. No. 60/603,078, filed Aug. 20, 2004, entitled SYSTEM FOR AUTOMATICALLY GATHERING BATTERY INFORMATION FOR USE DURING BATTERY TESTING/CHARGING; U.S. Ser. No. 10/958,821, filed Oct. 5, 2004, entitled IN-VEHICLE BATTERY MONITOR; U.S. Ser. No. 10/958,812, filed Oct. 5, 2004, entitled SCAN TOOL FOR ELECTRONIC BATTERY TESTER; U.S. Ser. No. 11/008,456, filed Dec. 9, 2004, entitled APPARATUS AND METHOD FOR PREDICTING BATTERY CAPACITY AND FITNESS FOR SERVICE FROM A BATTERY DYNAMIC PARAMETER AND A RECOVERY VOLTAGE DIFFERENTIAL, U.S. Ser. No. 60/587,232, filed Dec. 14, 2004, entitled CELLTRON ULTRA, U.S. Ser. No. 11/018,785, filed Dec. 21, 2004, entitled WIRELESS BATTERY MONITOR; which are incorporated herein in their entirety.

In general, battery testing and charging techniques have tended to use a single, integrated stand-alone unit.

SUMMARY OF THE INVENTION

An electronic battery tester or battery charger for testing or charging a storage battery including electrical connectors configured to electrically couple to a terminals of the storage battery. Circuitry couples to the electrical connectors and is configured to test or charge the storage battery. OBD communication circuitry provides an OBD output and/or input signal in accordance with an OBD communication standard. The circuitry is configured to couple to the battery test result.

DETAILED DESCRIPTION OF THE PREFERRED EMBODIMENTS

Typically, battery testers or battery chargers have been stand-alone units. The present invention provides a battery tester or charger 10 such as that illustrated in FIG. 1 which includes a databus 12 for coupling to external circuitry 14. Element 10 can comprise a battery test circuitry, battery charge circuitry, or a combination of both. Circuitry 14 is the internal circuitry of a vehicle 15 coupled together through an OBD (On-Board Diagnostics) databus. Circuitry 10 is configured to couple to storage battery 16 through electrical connectors 18 to perform a battery test on battery 16 or to charge battery 16. Connectors 18 can be, for example, Kelvin type connectors. When configured as a tester, circuitry 10 can obtain a dynamic parameter of the battery using an AC forcing function. Examples include dynamic conductance, resistance, admittance, impedance, their combinations, or others. However, any type of battery test can be performed including battery testing which involves application of large or small loads, or application of large currents or voltages such as through a charger, simple voltage measurements, etc. In one embodiment, the battery tester 10 is permanently mounted in a automotive vehicle such as the type of vehicle that uses a internal combustion engine, electric engine, or a hybrid.

Figure 1:
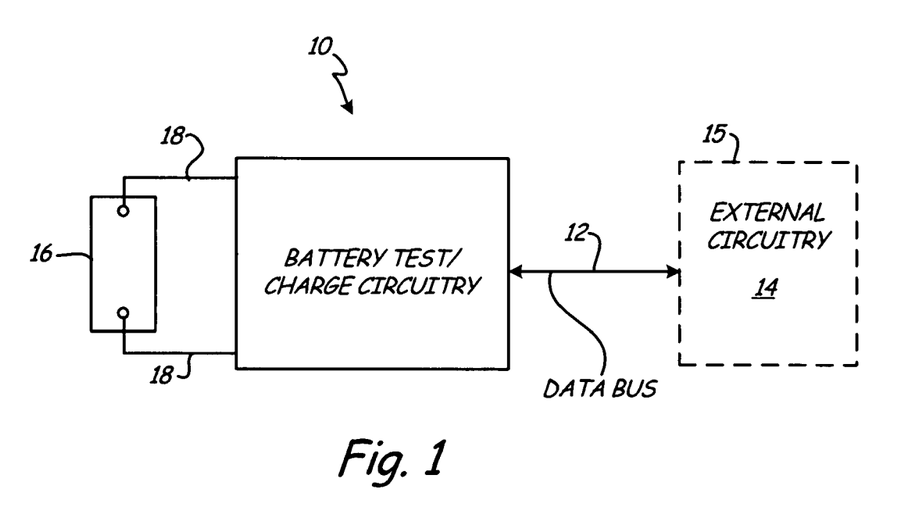
FIG. 1 is a simplified block diagram showing battery test or charge circuitry coupled to an on-board databus of the vehicle.

In another configuration, circuitry 10 comprises a battery charger and is configured to charge battery 16 through electrical connections 18. Further, in some configurations, circuitry 10 includes both testing and charging functionality. These functions can operate independently or, in some configurations, can be configured to operate together.

Databus 12 is used to exchange information with external circuitry 14 of vehicle 15. Such information includes, for example, raw data measurements and conclusions of battery tester 10, and inputs, such as user inputs, or any information related to vehicle 15 or other information available on bus 12, along with other sensor inputs into battery tester 10. Further, external circuitry 14 can control or communicate battery tester 10 through databus 12 and provide information such as a battery rating to 10 for use in performing a battery test or charging battery 16. Databus 12 can be a proprietary databus or can be in accordance with known standards such as RS232, CAN, ISA, PCI, PCMCIA, etc. In a specific embodiment, databus 12 is in accordance with an OBD communication protocol.

The circuitry 10 acquires information through bus 12 or monitors the flow of information on a databus of the vehicle. The circuit 10 can obtain information related to battery type, battery rating, charge history, etc. Additionally, if the vehicle contains an internal battery tester, information regarding battery tests or battery measurements can be obtained or monitored through bus 12. In such an embodiment, test circuit 10 does not need to perform a battery test itself, or couple to the battery.

Figure 2A:
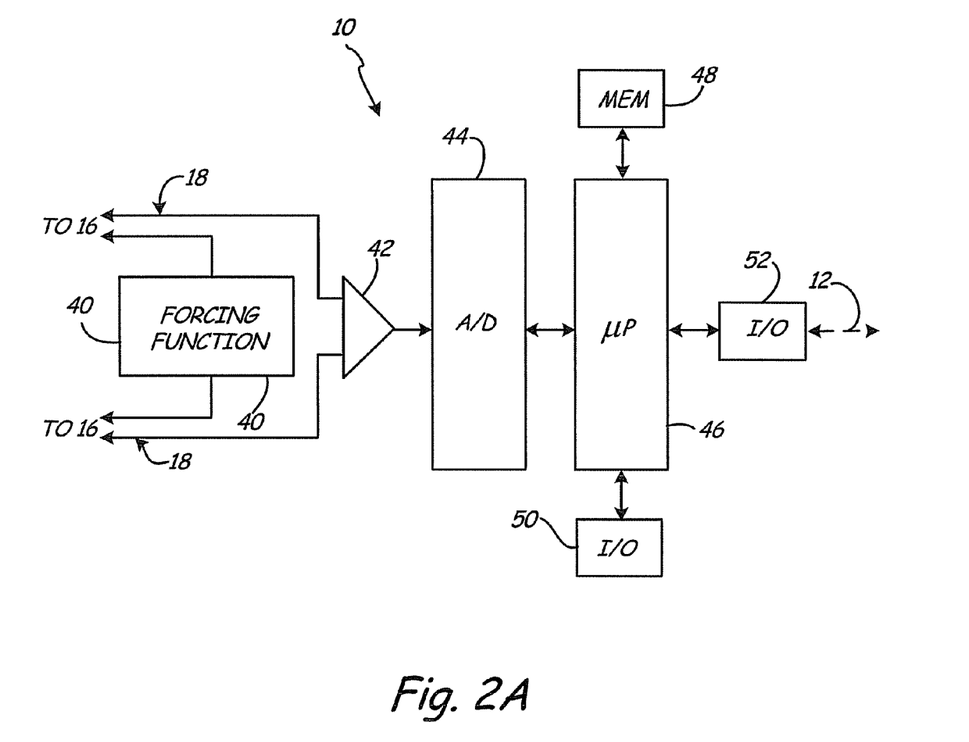
FIG. 2A is a simplified block diagram showing circuitry of FIG. 1 configured as a battery tester.
Figure 2B:
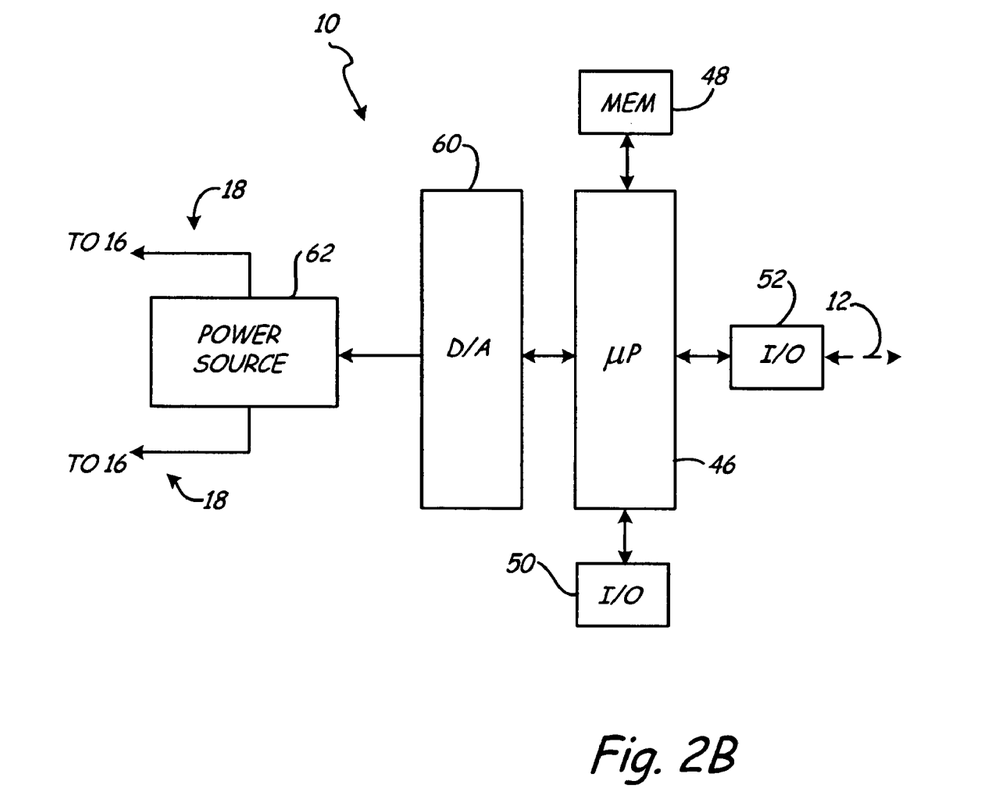
FIG. 2B is a simplified block diagram showing circuitry of FIG. 1 configured as a battery charger.

FIGS. 2A and 2B is a more detailed block diagram of circuitry 10. In FIG. 2A, circuitry 10 is configured to operate as a battery tester and includes a forcing function 40 and an amplifier 42 coupled to connectors 18. Connectors 18 are shown as Kelvin connections. The forcing function 40 can be any type of signal which has a time varying component including a transient signal. The forcing function can be through application of a load or by applying an active signal to battery 16. A response signal is sensed by amplifier 42 and provided to analog to digital converter 44 which couples to microprocessor 46. Microprocessor 46 operates in accordance with instructions stored in memory 48. Input/output (I/O) 52 is provided for coupling to the databus 12. I/O 102 can be in accordance with the desired standard or protocol as described herein. Another input/output block 50 can be used, for example, for communicating with an operator and can comprise a display and an input such as a keypad or the like.

In the illustrated embodiment, microprocessor 46 is configured to measure a dynamic parameter based upon the forcing function 40. This dynamic parameter can be correlated with battery condition as set forth in the above-mentioned Champlin and Midtronics, Inc. patents. However, other types of battery tests circuitry can be used in the present invention and certain aspects of the invention should not be limited to the specific embodiment illustrated herein. Although a microprocessor 46 is shown, other types of computational or other circuitry can be used to collect and place data into memory 48.

FIG. 2B is another simplified block diagram showing circuitry 10 configured as a battery charger. In such a configuration, the microprocessor 46 couples to a digital to analog converter 60 which is used to control a power source 62. Power source 62 couples to battery 16 through connections 18. Although a digital to analog converter 60 is illustrated as controlling a power source 62, other types of control can be used, for example, a simple switch, or other control mechanisms. The power source 62 can operate in accordance with any charging technique and may includes an internal power supply for charging the battery, or can be configured to couple to an external power source. One common external power source is simply the standard 120 volt, or 240 volt outlet power available in most settings. The power supply can also be used to power other aspects of circuitry 10. In one configuration the charger is separate from vehicle 15 and is not powered by an engine in the vehicle.

Figure 3:
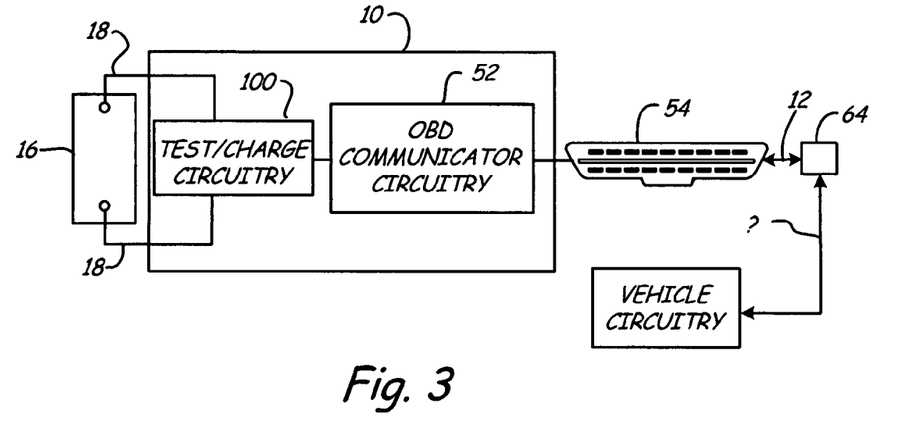
FIG. 3 is a block diagram showing a coupling between circuitry of FIG. 1 and the on-board databus of the vehicle.

FIG. 3 is a simplified block diagram showing an example configuration of battery tester/charger 10 in accordance with one embodiment of the invention. In the embodiment of FIG. 3, circuitry 10 is shown coupled to storage battery 16 through connections 18. As discussed above, this may comprise, for example, Kelvin connections. Circuitry 10 includes tester or charge circuitry 100. The circuitry 100 can be in accordance with any battery tester measurement or charging technique including those discussed above. The circuitry 100 may, in some configurations, include a microprocessor or other digital controller.

Circuitry 100 is configured to couple to battery 16 through electrical connectors 18. The circuitry 100 receives information from OBD communication circuitry 52. OBD communication circuitry 52 communicates through an OBD connector 54. The OBD communication circuitry 52 is configured to operate in accordance with OBD communication standards, such as, for example, J1850 PWM, J1850 VPW and/or ISO9141/14230. OBD communication circuitry 52 communicates in accordance with an OBD communication standard over databus 12 through OBD connector 54. OBD connector 54 is configured to be a standard OBD connection of the type used in automotive vehicles, for example in accordance with the standard J1962 connector. In various embodiments, circuitry within device 10 is powered by power received from battery 16, from an internal power source within device 10, and/or from power received from an external source.

The connector 54 includes 16 electrical "pins" or connectors and is configured to receive and electrically couple to an OBD plug 64 of vehicle 15. Circuitry 52 operates in accordance with OBD communication protocols for use in querying and communicating with the electrical system of automotive vehicles.

During operation as a battery tester, circuitry 10 performs a battery test on the storage battery 16. In accordance with the present invention, the battery tester receives information from the databus of the vehicle over the OBD connection. The data can be used as part of the battery test such that the battery test output is a function of the data, or can be used in addition to the battery test itself. In one aspect, any type of data which is available over the on-board databus of a vehicle. Specific examples include obtaining information regarding the age of the vehicle, battery specifications, number of times that the engine of the vehicle has been started, number of times that the battery has been disconnected, the size of the alternator, and the electrical options on a vehicle. Further, diagnostic information can be provided by the on-board databus including information related to the state of charge of the battery, the current draw from the battery, or the current draw of specific components of the electrical system, the starter voltage, etc. The information can be used to diagnose operation of the vehicle electrical system to assist in the battery test, or to assist in charging the battery. Some types of on-board databuses used in vehicles can contain a significant amount of information and data collected and generated based upon operation of the vehicle and subsystems thereof. This information can also be used by the circuitry 10.

In addition to receiving information from the databus, with the present invention, the on-board databus of the vehicle can be used to control operation of the vehicle. For example, operation of the engine can be controlled (such as engine speed), various loads within the vehicle can be turned on or off, the alternator set point can be controlled, starting of the vehicle can be inhibited, etc. This can also be used in configuration with testing or charging.

Newer types of vehicles include all electrical vehicles and hybrid vehicles which use a combination of both battery and internal combustion engines. In such vehicles, it can be difficult to directly test individual batteries of the vehicle. However, by using the ability of the present invention to access the on-board databus of the vehicle, additional information can be obtained during testing and/or charging of the batteries within the vehicle. For example, loads within the vehicle can be controlled, various voltages within the vehicle can be monitored, etc. In configurations in which the circuitry of the present invention is used to charge the battery, the on-board databus can be used to monitor the vehicle while the battery is being charged. For example, the databus can be used to obtain voltage (such as individual batteries or groups of batteries), or other information, from the vehicle as the vehicle undergoes charging.

When the circuitry of the present invention is configured as a charger, all of the information and control discussed above can be used in combination with charging of the vehicle. In some configurations, this can be used to provide feedback to the charging circuitry so that the charging can be controlled or terminated as desired.

With the present invention, any information which is available from the onboard databus can be used in conjunction with testing and/or charging. For example, information regarding the vehicle such as a vehicle identification number (VIN), battery type, battery voltage during start, vehicle age, engine size, and other information. The connection to the OBD can be used to control idle speed of the engine, turn on loads of the vehicle and to further automate aspects of the testing. Engine speed can also be read from the OBD connection. In some configurations, the circuitry is configured to test other aspects of the vehicle such as the alternator. The onboard OBD connection to the vehicle can be used to control aspects of the vehicle for alternator testing. Trouble codes within the vehicle system can be set using the OBD connection. For example, if a high rate of charging is detected, a trouble code can be set accordingly. In some vehicles, the connection to the OBD of the vehicle can be used to reset trouble codes. For example, the occurrence of a successful charge of the battery can be used to reset a trouble code. In some vehicles, various temperatures can be obtained from the onboard databus. This temperature information can also be used in conjunction with testing or charging. Engine hours, key off statistics, alternator current output and other information can be made available.

In some types of hybrid vehicles that contain multiple batteries, the on-board databus can be used to access intermediary voltages within a string of batteries. This information can be used by the present invention to, for example, detect imbalances in the voltages which may occur during charging. Such an imbalance can be indicative of a failing battery within the string.

The present invention provides a battery tester, electrical system tester and/or battery charger for use with vehicles, including hybrid vehicles. The circuitry of the present invention couples to the on-board databus of a vehicle and uses information from the databus, or controls aspects of the vehicle through the databus, in conjunction with the testing or charging. In some aspects, the test or charge is a function of information retrieved from the on-board databus. In other aspects, the test or charge controls operation of components of the vehicle using the connection of the vehicle through the on-board databus.

Although the various connections between components shown here are illustrated as being wired connections, the invention is also applicable with wireless connections such as using radio frequency (RF), infrared (IR), inductive coupling or though other wireless techniques. By providing the circuitry with access to the on board database of the vehicle, additional information can be garnered regarding operation of the vehicle and, in some configurations, operation of the vehicle can be controlled or otherwise configured.

Although the present application describes the OBD communication protocol, "OBD" is intended to include OBD II communication protocol as well. Example protocols include ISO and SAE standards. Specific examples include:
 ISO 9141
 ISO 9141-2
 ISO 14230
 ISO14230 1/2/3/4 Keyword Protocol 2000
 ISO11519 1/2/3 Low speed serial data communication
 ISO11898 1/2/3/4 CAN physical layer
 ISO11992 1/2/3 Digital information on electrical connections between towing and towed vehicles
 ISO15765: 1/2/3/4 Diagnostics on CAN SAE J1850 PWM
 SAE J1850 VPW
 SAE J1939: Recommended practice for Truck and Bus control and communication network
 SAE J2561: Bluetooth wireless protocol for automotive application
 SAE J1708: Serial data communication between microcomputer systems in Heavy-Duty Vehicle applications
 SAE J1850: Class B Data communication network for vehicle application
 SAE J2411: Single wire CAN network for vehicle application
 SAE J2610: SCI Communication
 SAE J2602: LIN Network for vehicle applications SAE J2284-1: High speed CAN at 125 kbps
SAE J2284-2: High speed CAN at 250 kbps
SAE J2284-3: High speed CAN at 500 kbps SAE J2366-1 ITS Databus Although the present invention has been described with reference to preferred embodiments, workers skilled in the art will recognize that changes may be made in form and detail without departing from the spirit and scope of the invention. For example, any type of battery test or battery charge circuitry can be used by battery tester 10. Further, the databus 12 can be in accordance with any databus technique and should not be limited to the examples set forth herein. In various embodiments, vehicle 15 comprises a vehicle having only an internal combustion engine, an electric vehicle, or a hybrid vehicle using both electric and combustion power. Typically, the circuitry 10 is separate from the vehicle 15. For example, the circuitry 10 can be embodied in a portable battery tester or charger. As used herein "battery maintenance device" refers generally to element 10 or variations thereof, and comprises a battery tester, a battery charger, or a device which is both a battery tester and a battery charger. Thus, circuitry 10 provides a battery maintenance device and includes generally battery maintenance circuitry such as circuitry 100 shown in FIG. 3.

What is claimed is:

1. A battery maintenance device for use with a storage battery of a vehicle, comprising:
   electrical connectors configured to couple to the battery;
   a databus connection configured to plug into an OBD connector of the vehicle which connects to a databus of the vehicle which carries information related to the vehicle; and
   battery maintenance circuitry coupled to the electrical connectors and the databus connection configured to coupled to the battery though the electrical connectors, to receive information related to the vehicle from the databus and wherein the operation of the battery maintenance circuitry is a function of the received information, the battery maintenance circuitry comprising battery test circuitry configured to measure a parameter of the battery though the electrical connectors and provide a battery test output as a function of the measured parameter, the battery test output further a function of the information related to the vehicle received from the databus, and wherein the battery test output comprises battery condition.

2. The apparatus of claim 1 wherein the battery maintenance circuitry further includes battery charge circuitry configured to charge the battery though the electrical connectors as a function of the received information.

3. The apparatus of claim 2 wherein the battery maintenance circuitry is configured to detect imbalances in voltages through the onboard databus which may occur during charging.

4. The apparatus of claim 2 wherein the charge circuitry controls charging of the battery based upon information received through the databus related to electrical voltages in the vehicle.

5. The apparatus of claim 1 wherein the battery test circuitry is configured to couple to the battery through Kelvin connections and the parameter of the battery comprises the dynamic parameter.

6. The apparatus of claim 1 wherein the OBD connector comprises 16 pins.

7. The apparatus of claim 1 wherein the received information from the databus of the vehicle is related to the age of the vehicle and the battery test output is a function of the received age information.

8. The apparatus of claim 1 wherein the received information from the databus of the vehicle is related to battery specifications and the battery test output is a function of the received battery specifications.

9. The apparatus of claim 1 wherein the received information from the databus of the vehicle is related to the number of times that the engine of the vehicle has been started and the battery test output is a function of the number of times the vehicles has been started.

10. The apparatus of claim 1 wherein the received information from the databus of the vehicle is related to whether the battery has been disconnected from the vehicle and the battery test output is a function of whether the battery has been disconnected from the vehicle.

11. The apparatus of claim 1 wherein the received information from the databus of the vehicle is related to the size of an alternator of the vehicle and the battery test output is a function of the size of the alternator.

12. The apparatus of claim 1 wherein the received information from the databus of the vehicle is related to operation of the vehicle and the battery test output is a function of operation of the vehicle.

13. The apparatus of claim 1 wherein the battery maintenance circuitry controls operation of the vehicle using the connection to the databus of the vehicle through the OBD connector.

14. The apparatus of claim 13 wherein the battery maintenance circuitry controls engine speed using the connection to the databus.

15. The apparatus of claim 13 wherein the battery maintenance circuitry controls loads within the vehicle using the connection to the databus.

16. The apparatus of claim 13 wherein the battery maintenance circuitry controls an alternator setpoint using the connection to the databus.

17. The apparatus of claim 13 wherein the battery maintenance circuitry inhibits starting of the vehicle using the connection to the databus.

18. The apparatus of claim 13 wherein the battery output is a function of operation of the vehicle controlled through the connection to the databus.

19. The apparatus of claim 1 wherein the vehicle comprises a hybrid vehicle.

20. The apparatus of claim 1 wherein the battery maintenance circuitry monitors voltages of the vehicle though the databus connection and the battery test output is a function of the monitored voltages.

21. The apparatus of claim 1 wherein the battery maintenance circuitry is configured to control trouble codes of the vehicle through the connection to the databus.

22. The apparatus of claim 1 wherein the battery maintenance circuitry couples to the databus through a wireless connection.

23. The apparatus of claim 1 wherein the battery maintenance circuitry is configured to write information to the vehicle through the OBD connector.

24. the apparatus of claim 23 wherein the write information comprises a trouble code.

25. The apparatus of claim 23 wherein the write information relates to trouble code reset.

26. The apparatus of claim 23 wherein the write information relates to current draw.

27. The apparatus of claim 23 wherein the write information relates to starter voltage.

28. The apparatus of claim 23 wherein the write information relates to battery state of charge.

29. The apparatus of claim 1 wherein the received information from the databus of the vehicle is related to battery type.

30. The apparatus of claim 1 wherein the received information from the databus of the vehicle is related to a VIN number for the vehicle.

31. The apparatus of claim 1 wherein the received information from the databus of the vehicle is related to battery start voltage.

32. The apparatus of claim 1 wherein the received information from the databus of the vehicle is related to engine size.

33. The apparatus of claim 1 wherein the received information from the databus of the vehicle is related to engine speed.

34. The apparatus of claim 1 wherein the received information from the databus of the vehicle is related to engine hours.

35. The apparatus of claim 1 wherein the received information from the databus of the vehicle is related to key off statistics.

36. The apparatus of claim 1 wherein the received information from the databus of the vehicle is related to electrical options in the vehicle.

37. A method of performing maintenance on a storage battery of a vehicle comprising:
   electrically connecting to the battery of the vehicle;
   electrically connecting a battery maintenance circuitry to a databus of a vehicle through an OBD connector, wherein the databus of the vehicle carries information related to the vehicle;
   receiving information from the databus related to the vehicle;
   performing battery maintenance on the battery with the battery maintenance circuitry through the electrical connectors coupled to the battery and wherein the maintenance performed on the battery is a function of the information related to the vehicle carried on the databus of the vehicle,
   wherein performing battery maintenance further comprises measuring a parameter of the battery through the electrical connectors and providing a battery test output as a function of the measured parameter and the received information which comprises a condition of the battery.

38. The method of claim 37 wherein the information from the databus of the vehicle is related to the age of the vehicle and the battery test output is a function of vehicle age.

39. The method of claim 37 wherein the information from the databus of the vehicle is related to battery specifications and the battery test output is a function of battery specifications.

40. The method of claim 37 wherein the information from the databus of the vehicle is related to the number of times that the engine of the vehicle has been started and the battery test output is a function of the number of times the engine has been started.

41. The method of claim 37 wherein the information from the databus of the vehicle is related to whether the battery has been disconnected from the vehicle and the battery test output is a function of whether the battery has been disconnected from the vehicle.

42. The method of claim 37 wherein the information from the databus of the vehicle is related to the size of an alternator of the vehicle and the battery test output is a function of the size of an alternator of the vehicle.

43. The method of claim 37 wherein the information from the databus of the vehicle is related to operation of the vehicle and the battery test output is a function of the operation of the vehicle.

44. The method of claim 37 including controlling operation of the vehicle using the connection to the databus of the vehicle through the OBD connector.

45. The method of claim 44 wherein controlling operation comprises controlling engine speed.

46. The method of claim 44 wherein controlling operation comprises controlling vehicle loads.

47. The method of claim 44 wherein controlling operation comprises controlling and alternator setpoint.

48. The method of claim 44 wherein controlling operation comprises inhibiting starting of the vehicle.

49. The method of claim 44 wherein the battery test output is a function of controlling operation of the vehicle.

50. The method of claim 37 wherein the vehicle comprises a hybrid vehicle.

51. The method of claim 37 including monitoring voltages of the vehicle through the databus connection and the battery test output is a function of the monitored voltages.

52. The method of claim 37 including controlling trouble codes of the vehicle through the databus.

53. The method of claim 37 including detecting imbalances in voltages through the onboard databus which may occur during charging.

54. The method of claim 37 wherein the battery maintenance circuitry couples to the databus through a wireless connection.

55. The method of claim 37 including writing information to the vehicle through the OBD connector.

56. The method of claim 55 wherein the write information comprises a trouble code.

57. The method of claim 55 wherein the write information relates to trouble code reset.

58. The method of claim 55 wherein the write information relates to current draw.

59. The method of claim 55 wherein the write information relates to starter voltage.

60. The method of claim 55 wherein the write information relates to battery state of charge.

61. The method of claim 37 wherein information received from the databus of the vehicle is related to battery type.

62. The method of claim 37 wherein information received from the databus of the vehicle is related to a VIN number for the vehicle.

63. The method of claim 37 wherein information received from the databus of the vehicle is related to battery start voltage.

64. The method of claim 37 wherein information received from the databus of the vehicle is related to engine size.

65. The method of claim 37 wherein information received from the databus of the vehicle is related to engine speed.

66. The method of claim 37 wherein information received from the databus of the vehicle is related to engine hours.

67. The method of claim 37 wherein information received from the databus of the vehicle is related to key off statistics.

68. The method of claim 37 wherein information received from the databus of the vehicle is related to electrical options in the vehicle.

69. The method of claim 37 including controlling charging of the battery based upon information received through the databus.

* * * * *